(12) United States Patent
Matsuura

(10) Patent No.: US 6,208,469 B1
(45) Date of Patent: Mar. 27, 2001

(54) METHOD OF ADJUSTING REDUCTION PROJECTION EXPOSURE DEVICE

(75) Inventor: Seiji Matsuura, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/418,500

(22) Filed: Oct. 15, 1999

(30) Foreign Application Priority Data

Oct. 16, 1998 (JP) .................................................. 10-294988

(51) Int. Cl.$^7$ .................................................. G02B 27/14
(52) U.S. Cl. .......................... 359/637; 359/622; 355/53; 355/67; 250/548; 430/30
(58) Field of Search .................................... 359/619, 622, 359/637, 623; 355/53, 71, 77, 67; 250/548; 430/30

(56) References Cited

U.S. PATENT DOCUMENTS

| | | | |
|---|---|---|---|
| 5,208,629 | * | 5/1993 | Matsuo et al. .......................... 355/53 |
| 5,760,963 | * | 6/1998 | Mori ...................................... 359/622 |
| 5,783,833 | * | 7/1998 | Sugaya et al. ......................... 250/548 |
| 5,945,239 | * | 8/1999 | Taniguichi ............................... 430/30 |
| 6,078,381 | * | 6/2000 | Suzuki .................................... 355/53 |

* cited by examiner

*Primary Examiner*—Loha Ben
(74) *Attorney, Agent, or Firm*—Sughrue, Mion, Zinn, Macpeak & Seas, PLLC (57) ABSTRACT

This invention is a method of adjusting a reduction projection exposure device having a light source, an illumination optical system, and a reduction image-forming optical system. The invention has the step of transferring identical transfer patterns to positions of an exposure field on a photoresist film, the step of calculating a dimensional variation in CD (Critical Dimension) of the transfer patterns and a variation in exposure dose latitude in the exposure field, the first determination step of determining that the illumination optical system and the reduction image-forming optical system need not be adjusted when the dimensional variation in CD is smaller than a first predetermined percent, the second determination step of determining that the illumination optical system has a σ-error to be adjusted when the dimensional variation in CD is the first predetermined percent or more and when the variation in exposure dose latitude is smaller than a second predetermined percent, and the third determination step of determining that the reduction image-forming optical system has a lens aberration to be adjusted when the dimensional variation in CD is the first predetermined percent or more and when the variation in exposure dose latitude is the second predetermined percent or more.

7 Claims, 11 Drawing Sheets

METHOD OF ADJUSTING REDUCTION PROJECTION EXPOSURE DEVICE

BACKGROUND OF THE INVENTION

1. Field of the Invention

The present invention relates to a method of adjusting a reduction projection exposure device and, more particularly, to a method of a reduction projection exposure device which is designed to make it possible to reliably determine whether an illumination optical system should be adjusted or a reduction image-forming optical system should be adjusted when the reduction projection exposure device is adjusted to suppress a dimensional variation in transfer pattern in one exposure field.

2. Description of the Related Art

In the processes of manufacturing a semiconductor device, photolithography is popularly used in patterning of various portions such as a gate electrode, a wiring, a contact hole, and the like. The photolithography is constituted by the step of transferring a mask pattern of a photomask to a photoresist film on a wafer and the step of processing an underlying layer using the patterned photoresist film as a mask. In the process of transferring the pattern, the pattern is exposed by an exposure device through the photomask to transfer the mask pattern to the photoresist film.

Figure 1:
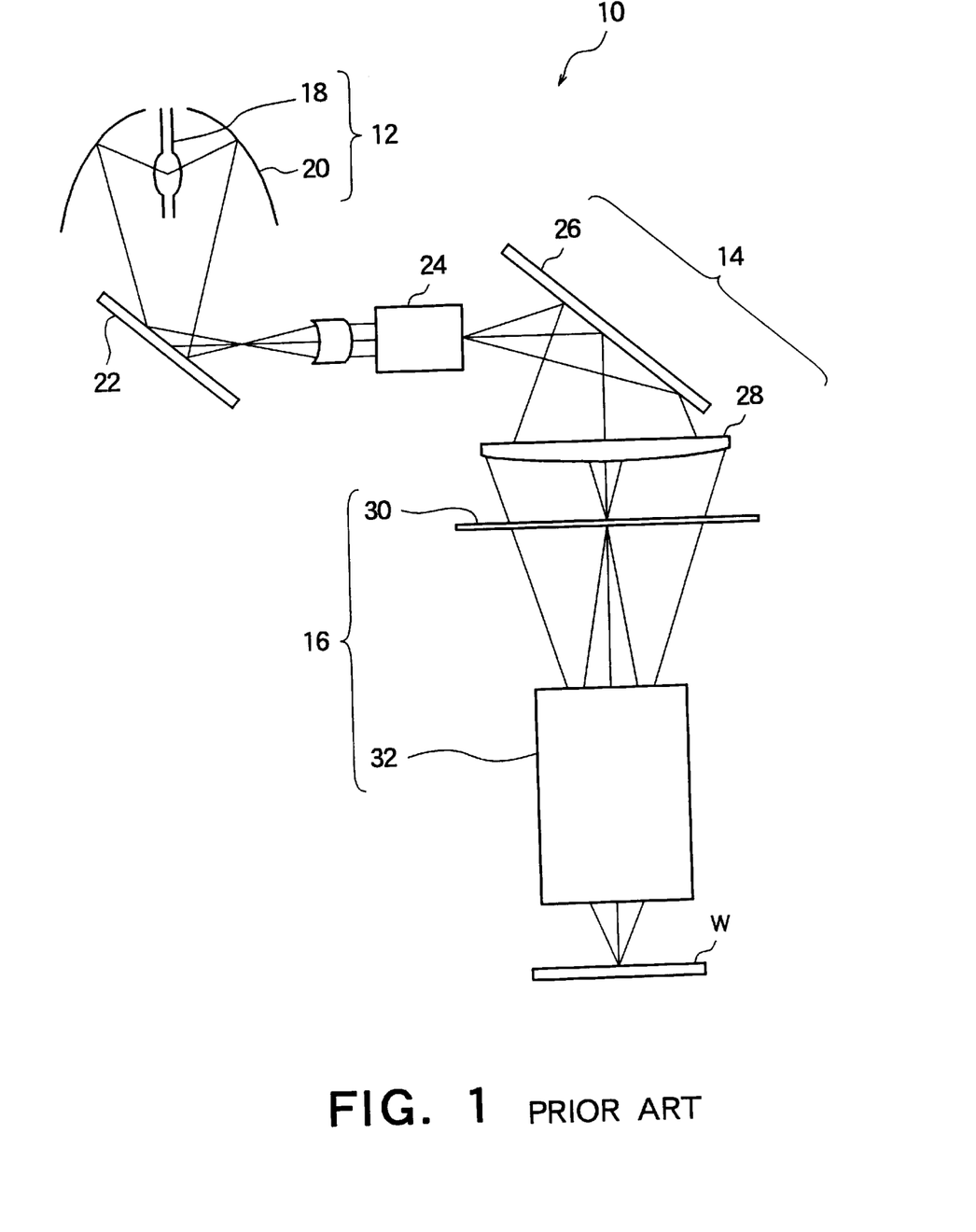
FIG. 1 is a typical view showing the configuration of a conventional reduction projection exposure device.

The configuration of the reduction projection exposure device will be described below with reference to FIG. 1. FIG. 1 is a typical view showing the configuration of the reduction projection exposure device.

A general reduction projection exposure device 10, as shown in FIG. 1, includes a light source 12, an illumination optical system 14, and a reduction image-forming optical system 16.

The light source 12 comprises a mercury vapor lamp 18 serving an emission source and an elliptical mirror 20 for converging light emitted from the mercury vapor lamp 18.

The illumination optical system 14 comprises a mirror 22, a fly-eye lens 24, a mirror 26, and a condenser lens 28. The illumination optical system 14 causes light emitted from the light source 12 to be incident on the condenser lens 28 with a uniform light intensity distribution by the mirror 22, the fly-eye lens 24, and the mirror 26, and converges the light.

The reduction image-forming optical system 16 comprises a mask (reticle) 30 having a pattern to be exposed and a reduction lens 32. The reduction image-forming optical system 16 irradiates the light converged by the condenser lens 28 on the mask 30, causes the reduction lens 32 to reduce the light passing through the pattern of the mask 30, and irradiates the reduced mask pattern on a wafer W to expose the mask pattern.

When a pattern is transferred to a wafer by using a reduction projection exposure device, and when identical patterns in the same exposure field, e.g., wiring patterns each including a large number of identical lines are to be transferred, the wiring pattern transferred to a central region of the exposure field is different from the wiring pattern transferred to a peripheral region of the same exposure field in the line widths of the wiring patterns.

For example, in an independent-line pattern, the line widths of the line-like pattern in the central region and the peripheral region are different from each other, i.e., the line width varies in the exposure field. As important factors which cause the variation, a lens aberration which occurs in a lens of the reduction image-forming optical system and a σ-error which occurs in a fly-eye lens of the illumination optical system are known. In this case, the isolated line indicates a pattern in which another pattern is not present in a region having a width which is four to five times the line width of the isolated line.

The σ-error indicates a variation in coherent of light or non-uniformity of the light intensity of mask illumination. As the σ-error is large, the variation in coherent is large, and the non-uniformity of the light intensity of the mask illumination is great.

Therefore, in order to keep the dimensional uniformity of the line width of a line, the illumination optical system and the reduction image-forming optical system are inevitably adjusted.

Adjustment of the illumination optical system and the reduction image-forming optical system can also be performed by directly measuring the aberration of a lens by using a wave front measurer before the lens is incorporated in the exposure device. However, once the lens is incorporated in the exposure device, detachment of the lens from the exposure device, measurement of the lens aberration, adjustment of the lens aberration, and incorporation of the lens in the exposure device again are very cumbersome. In addition, this operation requires great skill, and is actually difficult to be performed.

Therefore, conventionally, the dimensions of a resist pattern obtained by test exposure are measured to determine whether the dimensional variation is caused by the illumination optical system or the reduction image-forming optical system on the basis of the following indexes.

Figure 2A:
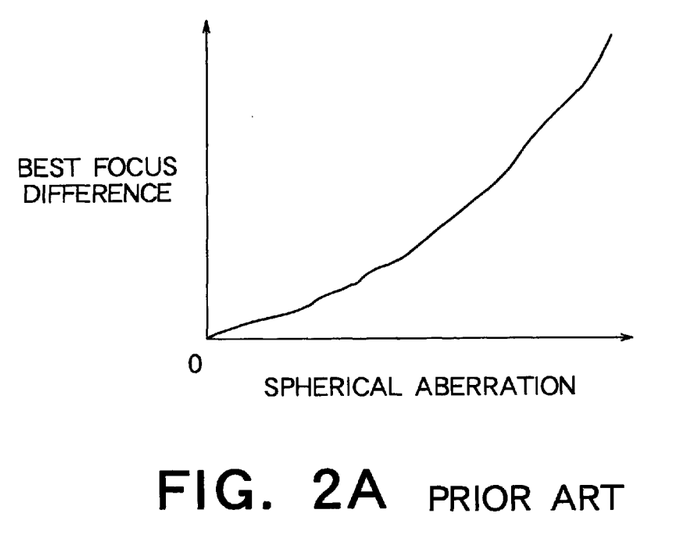
FIG. 2A is a graph showing a relationship between a best focus difference and a spherical aberration.

The first index is a best focus difference between large-dimension and small-dimension L&S patterns. The best focus difference and a spherical aberration have a predetermined relationship, as shown in FIG. 2A. Since the spherical aberration is large when the best focus difference is large, the spherical aberration can be calculated by calculating the best focus difference. The best focus difference is the difference between the focal length of the large pattern of the L&S patterns and the focal length of the small pattern of the L&S patterns.

Figure 2B:
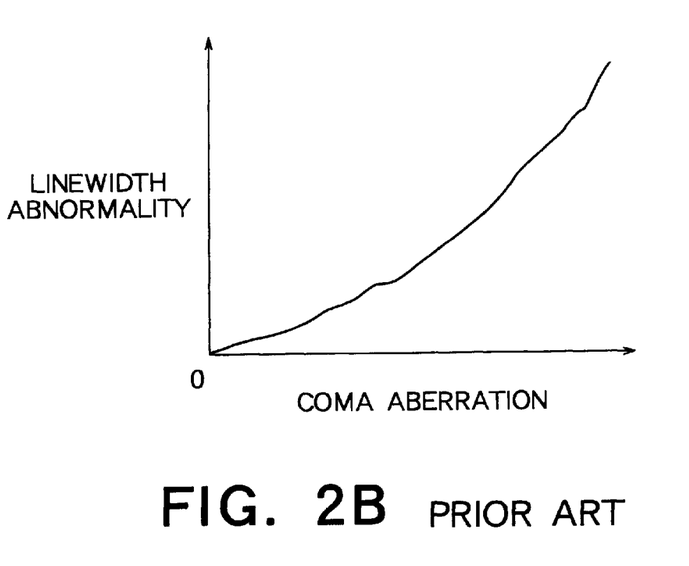
FIG. 2B is a graph showing a relationship between a linewidth abnormality and a coma aberration.

The second index is a linewidth abnormality. The linewidth abnormality is calculated by equation:

$$\text{linewidth abnormality} = (L_1 - L_5)/(L_1 + L_5),$$

where $L_1$ and $L_5$ are the line widths of five L&S patterns at both the ends, respectively. The linewidth abnormality and a coma aberration aberration have a predetermined relationship, as shown in FIG. 2B. Since the coma aberration aberration is large when the linewidth abnormality is large, the coma aberration can be calculated by calculating the linewidth abnormality.

The third index is a line width difference, the line width difference is calculated by equation:

$$\text{line width difference} = \{(L_1 + L_5)/2\} - L_3,$$

where $L_1$ and $L_5$ are line widths of five L&S patterns at both the ends, respectively, and $L_3$ is a line width of the five L&S patterns at the center.

The proximity effect of patterns which are close to each other can be estimated by the size of the line width difference. Since the values of $L_1$ and $L_5$ largely vary depending on both the lens aberration of a projection lens and the σ-error, the proximity effect mentioned here is a proximity effect including all the factors.

However, the above method of determining whether adjustment is required or not has various problems.

First, all the indexes described above are related to a lens aberration or a proximity effect varied by the lens aberration and a σ-error, and the size of only the σ-error cannot be detected. In other words, in the conventional methods based on the first to third indexes, whether adjustment of a reduction image-forming optical system is required or not can be determined, but whether adjustment of an illumination optical system is required or not cannot be independently determined.

Figure 3A:
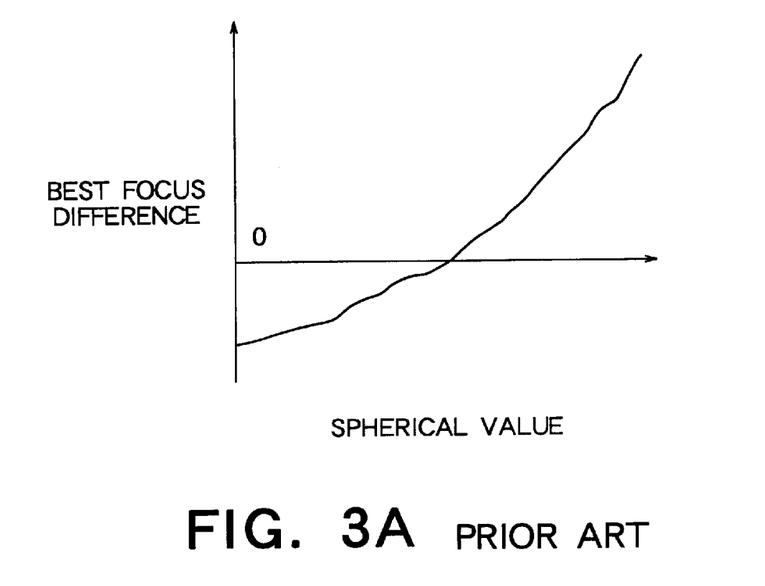
FIG. 3A is a graph showing an actual relationship between a best focus difference and a spherical aberration.

Second, the relationship between the best focus difference and the spherical aberration is not limited to the relationship shown in FIG. 2A. In general, the relationship shown in FIG. 3A is frequently employed. If the best focus difference is approximate to 0, the actual spherical aberration is often large.

Figure 3B:
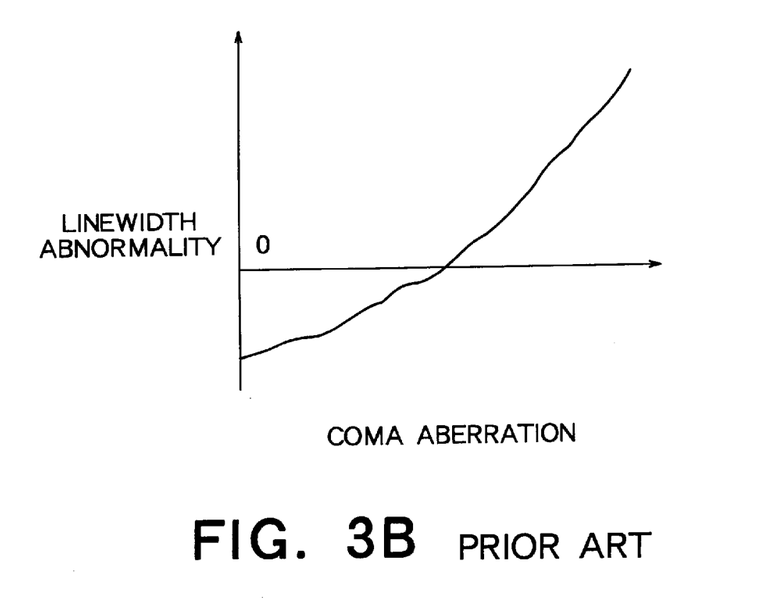
FIG. 3B is a graph showing an actual relationship between a linewidth abnormality and a coma aberration.

Similarly, the relationship between the linewidth abnormality and the coma aberration is not limited to the relationship shown in FIG. 2B. In general, the relationship shown in FIG. 3B is frequently employed. If the linewidth abnormality is approximate to 0, the actual coma aberration is often large.

The drawbacks described above are caused by the following reasons. That is, the measurement values of a linewidth abnormality and a best focus difference which are actually measured have problems related to precision. For example, the focal distance of a small-dimension L&S pattern is technically very difficult to be measured, and the measurement value of the best focus difference easily includes an error. In addition, the errors of mask pattern dimensions directly adversely affect the measurement value of the linewidth abnormality, and an error easily occurs in the linewidth abnormality.

Third, if a best focus difference and a linewidth abnormality are measured in the form which is free from the measurement error to adjust the exposure device such that the best focus difference and the linewidth abnormality become 0, a practical problem that the dimensional uniformity of an actual pattern is poor is posed because of a problem on the optical design of the exposure device and a manufacturing error.

In this state, determination of whether adjustment of the exposure device is required or not is actually difficult. If an exposure process is performed by using an exposure device which has not been adjusted, a pattern having good dimensional uniformity cannot be transferred.

SUMMARY OF THE INVENTION

It is an object of the present invention to provide a method of adjusting a reduction projection exposure device which is designed to make it possible to reliably determine whether an illumination optical system should be adjusted or a reduction image-forming optical system should be adjusted when the reduction projection exposure device is adjusted to suppress a dimensional variation in transfer pattern in one exposure field.

According to the present invention, there is provided a method of adjusting a reduction projection exposure device having a light source, an illumination optical system for causing light emitted from the light source to have a uniform light intensity distribution, and a reduction image-forming optical system for irradiating a mask pattern of a photomask on a photoresist film of a wafer by the light passing through the illumination optical system to obtain a transfer pattern, comprising the test exposure step of transferring identical transfer patterns at a plurality of positions on the photoresist film in one exposure field by using a test mask having a plurality of identical mask patterns on a mask surface, the variation calculation step of calculating a dimensional variation in identical transfer pattern in one exposure field and a variation in exposure dose latitude in one exposure field, the first determination step of determining that the illumination optical system and the reduction image-forming optical system need not be adjusted when the dimensional variation in identical transfer pattern in one exposure field is smaller than a first predetermined percent, the second determination step of determining that the illumination optical system includes a a-error to be adjusted when the dimensional variation in identical transfer pattern in one exposure field is not smaller the first predetermined percent and when the variation in exposure dose latitude is smaller than a second predetermined percent, and the third determination step of determining that the reduction image-forming optical system includes a lens aberration to be adjusted when the dimensional variation in identical transfer pattern in one exposure field is not smaller than the first predetermined percent and when the variation in exposure dose latitude is not smaller than the second predetermined percent.

DESCRIPTION OF THE PREFERRED EMBODIMENT

In order to develop a new method of adjusting an exposure device, the present inventor introduces the concept of an exposure dose latitude in addition to a best focus difference, a linewidth abnormality, and a line width value which are conventionally used.

The exposure dose latitude is a difference between a maximum light intensity and a minimum light intensity at which the sectional shape of a transferred pattern which is obtained by the following manner falls within the range of an allowable shape. That is, a light intensity at which the sectional shape of a pattern transferred to a photoresist film is normal is represented by $X_1$, and the light intensity of a light source increases to $X_1+\Delta X_1$, $X_1+2\Delta X_1$, . . . with reference to $X_1$. In contrast to this, the light intensity decreases to $X_1-\Delta X_1$, $X_1-2\Delta X_1$, . . . , and a pattern including a plurality of isolated lines is transferred to the photoresist film.

Figure 7A:
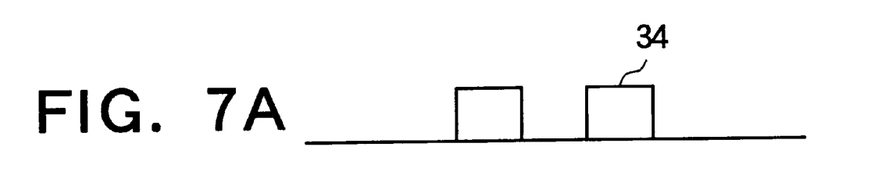
FIGS. 7A to 7E are sectional views for explaining exposure dose latitudes in the present invention.
Figure 7B:
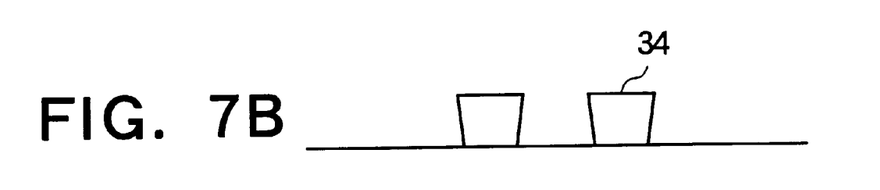

For example, assume that the sectional shapes of patterns 34 of a photoresist film when exposure is performed at a light intensity $X_1$ are normal sectional shapes as shown in FIG. 7A. At a light intensity $X_1+\Delta X_1$, assume that the sectional shapes of the patterns 34 are sectional shapes which are slightly tapered at the lower portions as shown in FIG. 7B. At a light intensity $X_1+2\Delta X_1$, assume that the sectional shapes of the patterns 34 are sectional shapes considerably tapered at the lower portions as shown in FIG. 7C.

Figure 7C:
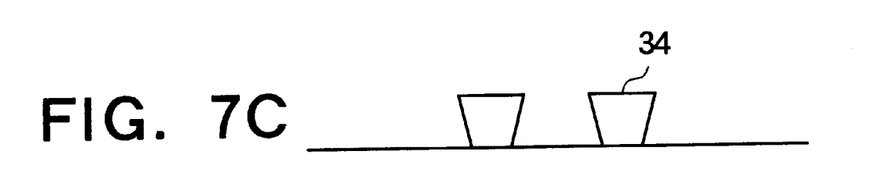
Figure 7D:
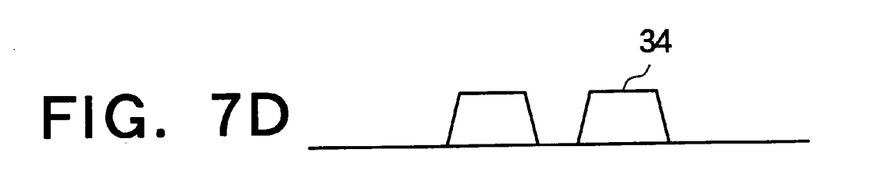

In contrast to this, at the light intensity $X_1-\Delta X_1$, assume that the sectional shapes of the patterns 34 are sectional shapes which are thickened at the lower portions as shown in FIG. 7D. At the light intensity $X_1-2\Delta X_1$, assume that the sectional shapes of the patterns 34 are sectional shapes which are considerably thickened at the lower portions to be brought into contact with each other as shown in FIG. 7E.

Figure 7E:
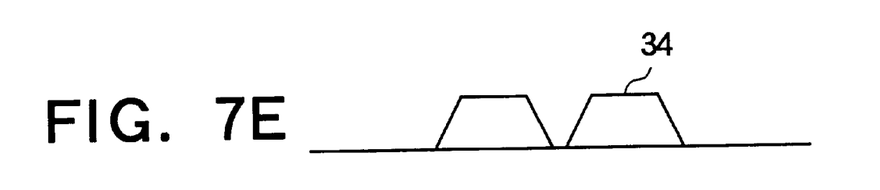

Although the sectional shapes shown in FIG. 7B and the sectional shapes shown in FIG. 7D are allowed, when the sectional shapes shown in FIG. 7C and the sectional shapes shown in FIG. 7E are not allowed, an exposure dose latitude is given by:

$$\text{exposure dose latitude} = \{E(-10\%) - E(+10\%)\}/Eop.$$

Herein, E(+10%) is exposure dose which increases a resist pattern dimension by 10% more than the aim thereof. E(−10%) is exposure dose which decreases the resist pattern dimension by 10% less than the aim thereof. Eop is exposure dose which fits the resist pattern dimension to the aim thereof.

Whether the sectional shape is allowed or not is generally determined by checking whether the dimensions of the sectional shape of a resist pattern fall within the range of ±10% of the dimensions of a mask pattern.

Figure 8:
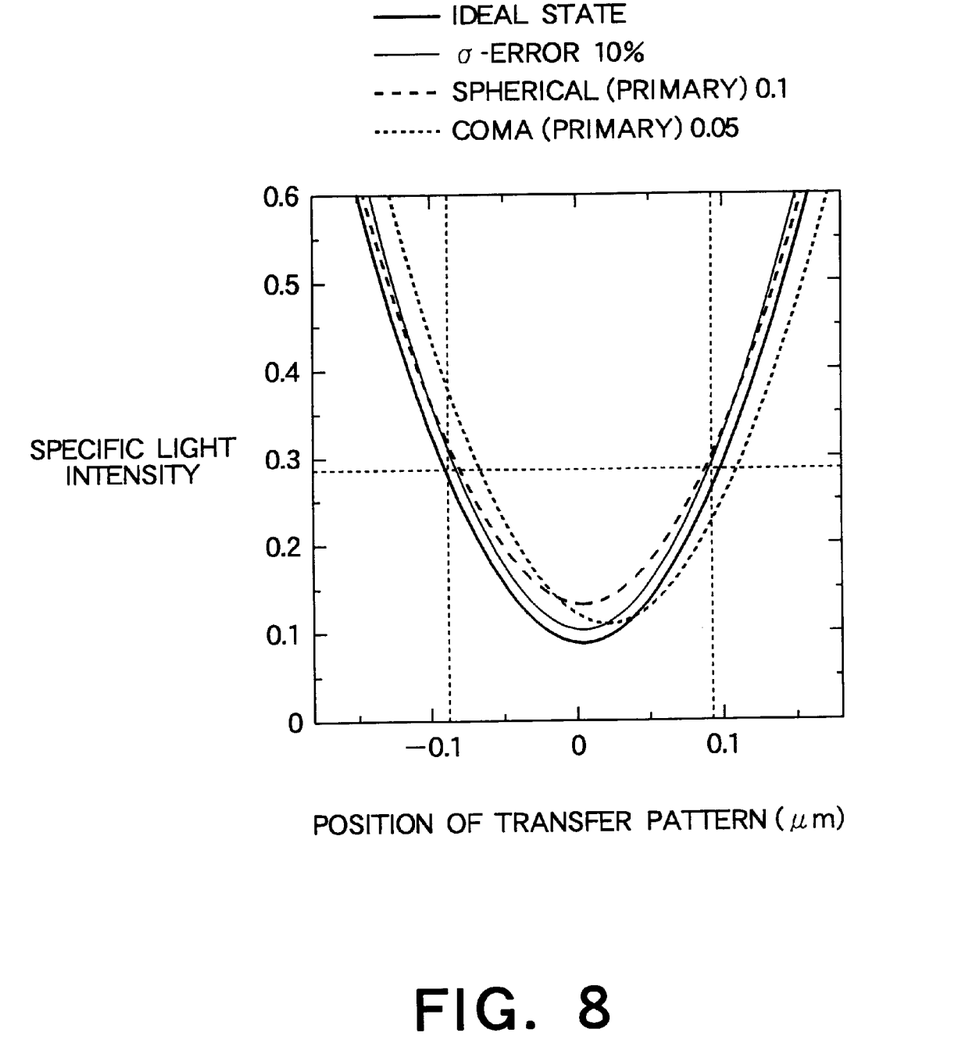
FIG. 8 is a graph showing surface positions of a transfer pattern and specific light intensities at the respective surface positions in an embodiment of the present invention.

In order to show light intensity distributions at surface positions on a lateral section of a transfer pattern of isolated lines obtained by transferring a pattern to a photoresist film by using a mask pattern of isolated lines, the present inventor performed simulation calculation for an exposure device comprising an ideal illumination optical system and an ideal reduction image-forming optical system, an exposure device comprising an illumination optical system having a σ-error of 10% and an ideal illumination optical system, an exposure device comprising an ideal illumination optical system and a reduction image-forming optical system having a spherical aberration having a primary aberration coefficient of 0.1, and an exposure device comprising an ideal illumination optical system and a reduction image-forming optical system having a coma aberration having a primary aberration coefficient of 0.05 to obtain the result shown in the graph of FIG. 8.

Figure 9:
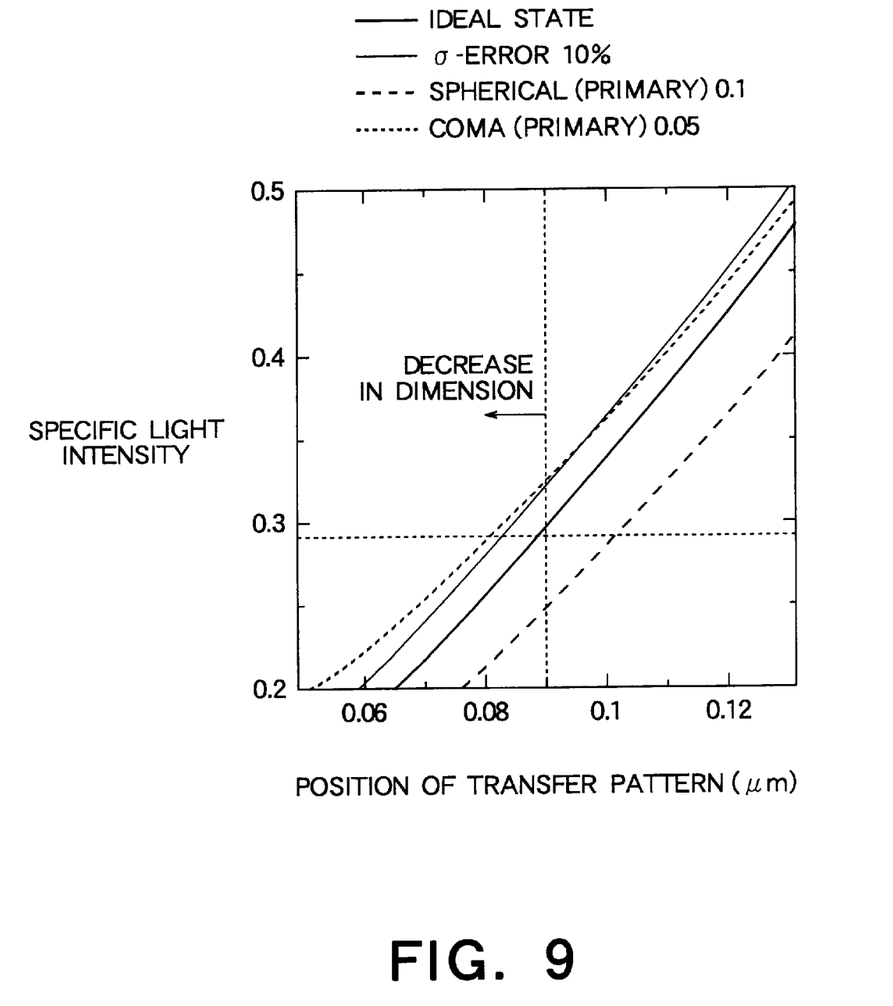
FIG. 9 is a graph obtained by partially enlarging the graph in FIG. 8.

In FIG. 8, on the abscissa, surface positions on a lateral section of a transfer pattern obtained by transfer are indicated by distances in both line width directions by using a longitudinal center line of the transfer pattern as a reference line, and the ordinate indicates specific light intensities obtained when the light intensity of light transmitted through a transparent mask pattern is defined as 1.0, i.e., the light intensities of light components reaching the surface positions of the transfer pattern. FIG. 9 is a graph obtained by partially enlarging the graph in FIG. 8.

FIG. 8 shows that a variation in exposure dose latitude is small because although the contrast of light intensities in the exposure device having a σ-error of 10% in the illumination optical system is slightly poorer than that of the ideal exposure device, these contrasts are not largely different from each other.

In contrast to this, in the exposure device having a spherical aberration having a primary spherical aberration coefficient of 0.1 in the reduction image-forming optical system and the exposure device having a coma aberration having a primary coma aberration coefficient of 0.05 in the reduction image-forming optical system, the contrasts of light intensities are considerably poorer than that of the ideal exposure device, and a large variation in exposure dose latitude is exhibited.

The magnitude of the contrast of light intensities is generally normalized by the size of a standardized inclination (log slope) of a pattern edge portion. A large log slope means a large exposure amount.

Figure 10:
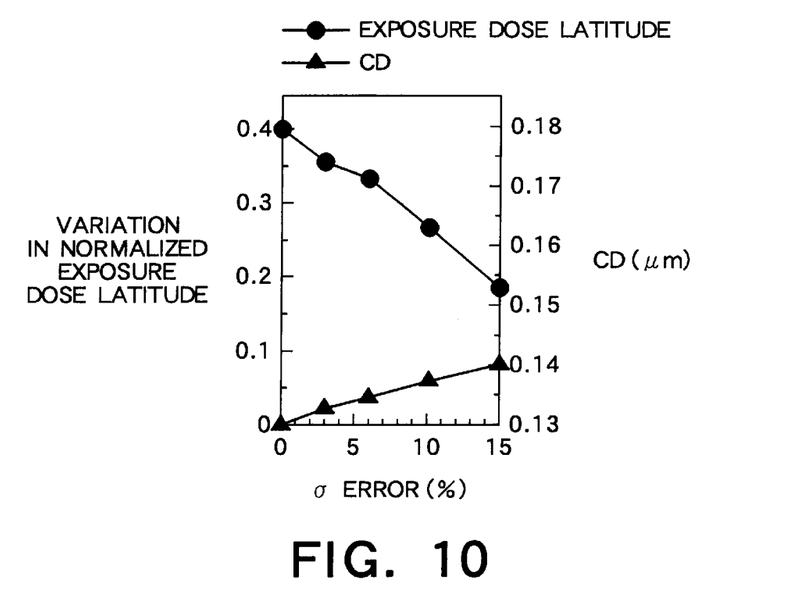
FIG. 10 is a graph showing a relationship between σ-σ-error and a variation in exposure dose latitude and a relationship between the σ-error and a CD (Critical Dimension) in an embodiment of the present invention.
Figure 11:
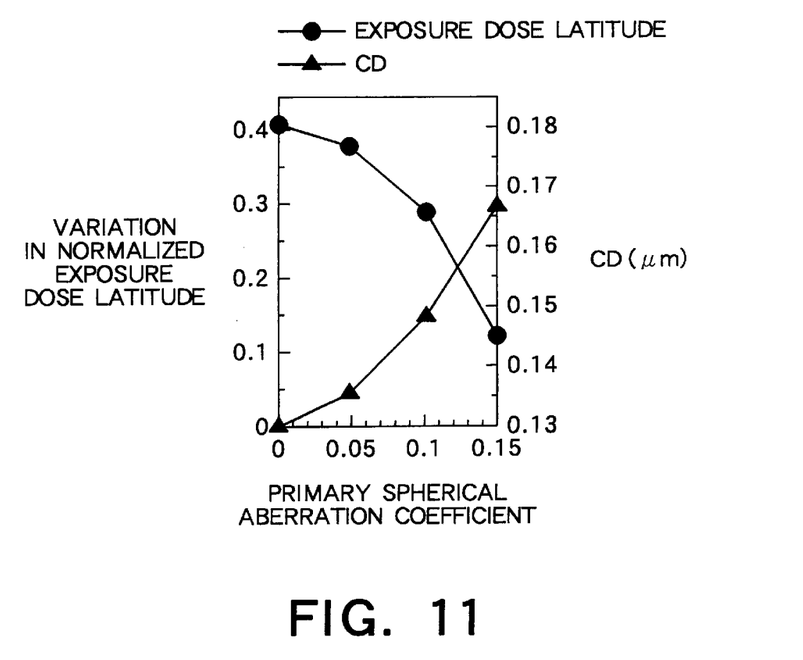
FIG. 11 is a graph showing a relationship between a primary spherical aberration coefficient and a variation in exposure dose latitude and a relationship between the primary spherical aberration coefficient and a CD in an embodiment of the present invention.
Figure 12:
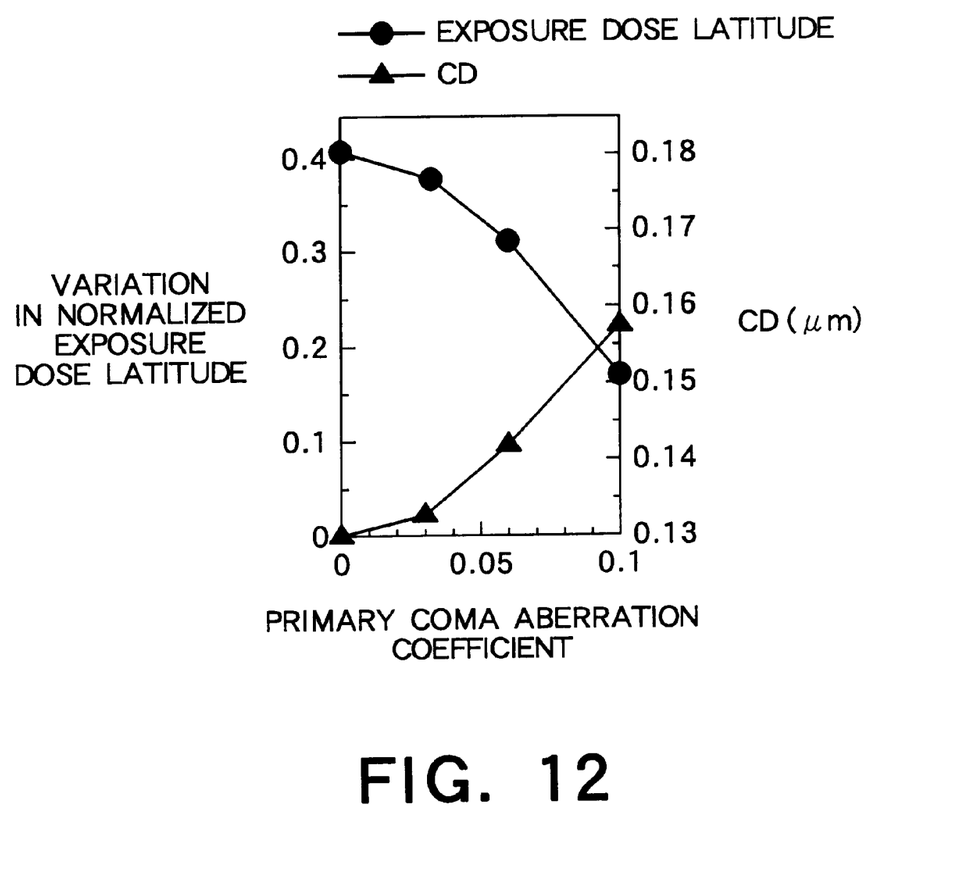
FIG. 12 is a graph showing a relationship between a primary coma aberration coefficient and a variation in exposure dose latitude and a relationship between the primary coma aberration coefficient and a CD in an embodiment of the present invention.

Under an ordinary illumination of NA/σ=0.6/0.75, with respect to an isolated line having a line width (converted into transfer pattern dimension) of 0.18 μm, simulation calculation of a variation in exposure margin and a CD (Critical Dimension, e.g., a line width in case of an independent pattern of a line pattern) is performed for each of a σ-error, a spherical aberration, and a coma aberration, and the results are collected in FIGS. 10 to 12.

In FIGS. 10 to 12, variations in exposure dose latitude on the ordinate shown as values normalized on the assumption that the exposure dose latitude of the maximum range value is set to be 1.0.

FIG. 10 shows a relationship between a σ-error and a variation in exposure dose latitude and a relationship between the σ-error and a CD.

FIG. 11 shows a relationship between a primary spherical aberration coefficient and a variation in exposure dose latitude and a relationship between the primary spherical aberration coefficient and a CD.

FIG. 12 shows a relationship between a primary coma aberration coefficient and a variation in exposure dose latitude and a relationship between the primary coma aberration coefficient and a CD.

FIG. 10 shows that a decrease of a variation in exposure dose latitude is 10% or less when the dimension of an isolated line decreases from 0.18 μm to 0.15 μm due to a σ-error, and that the variation in exposure dose latitude is small when a change in CD is caused by the σ-error.

On the other hand, FIGS. 11 and 12 show that decreases of variations in exposure dose latitude are 15% to 20% or more when the dimension of an isolated line decreases from 0.18 μpm to 0.15 μm due to a spherical aberration and a coma aberration, and that the variation in exposure dose latitude is large when a change in CD is caused by the spherical aberration and the coma aberration.

In order to achieve the above object, on the basis of the above knowledge, the present invention employs a method of adjusting a reduction projection exposure device described in the SUMMARY described above.

Since the present invention comprises the second determination step and the third determination step, whether the illumination optical system or the reduction image-forming optical system of the exposure device is required to be adjusted can be reliably determined, and a required adjustment amount can be reliably determined.

In the present invention, the first predetermined percent for determining whether a dimensional variation in identical transfer pattern in an exposure field is good or not is generally 10%. The second predetermined percent for determining whether a variation in exposure dose latitude is good or not is generally 10%.

In a preferred embodiment of the present invention, a test mask used in the test exposure step can transfer patterns having high-density patterns and independent patterns to at least nine positions uniformly distributed in an exposure field of one exposure shot.

More specifically, a dimensional variation in transfer pattern is defined by:
dimensional variation in transfer pattern=(range value of pattern dimensions/average value of pattern dimensions).

The variation in exposure dose latitude is defined by:
variation in exposure dose latitude=(range value of exposure dose latitudes/average value of exposure dose latitudes).

Another preferred embodiment of the present invention has, subsequent to the third determination step, the first adjustment step for adjusting the reduction image-forming optical system such that a variation in exposure dose latitude is equal to or smaller than the second predetermined percent.

The first adjustment step determines that a spherical aberration is large when a best focus difference is equal to or larger than a predetermined value, and adjusts the reduction image-forming optical system. The first adjustment step determines that a coma aberration is large when a linewidth abnormality is equal to or larger than a predetermined value, and adjust the reduction image-forming optical system.

In addition, the embodiment has the second adjustment step of adjusting the illumination optical system such that a σ-error is decreased according to the determination executed in the second determination step.

A concrete embodiment of the present invention will be described below in detail with reference to the accompanying drawings.

Figure 4:
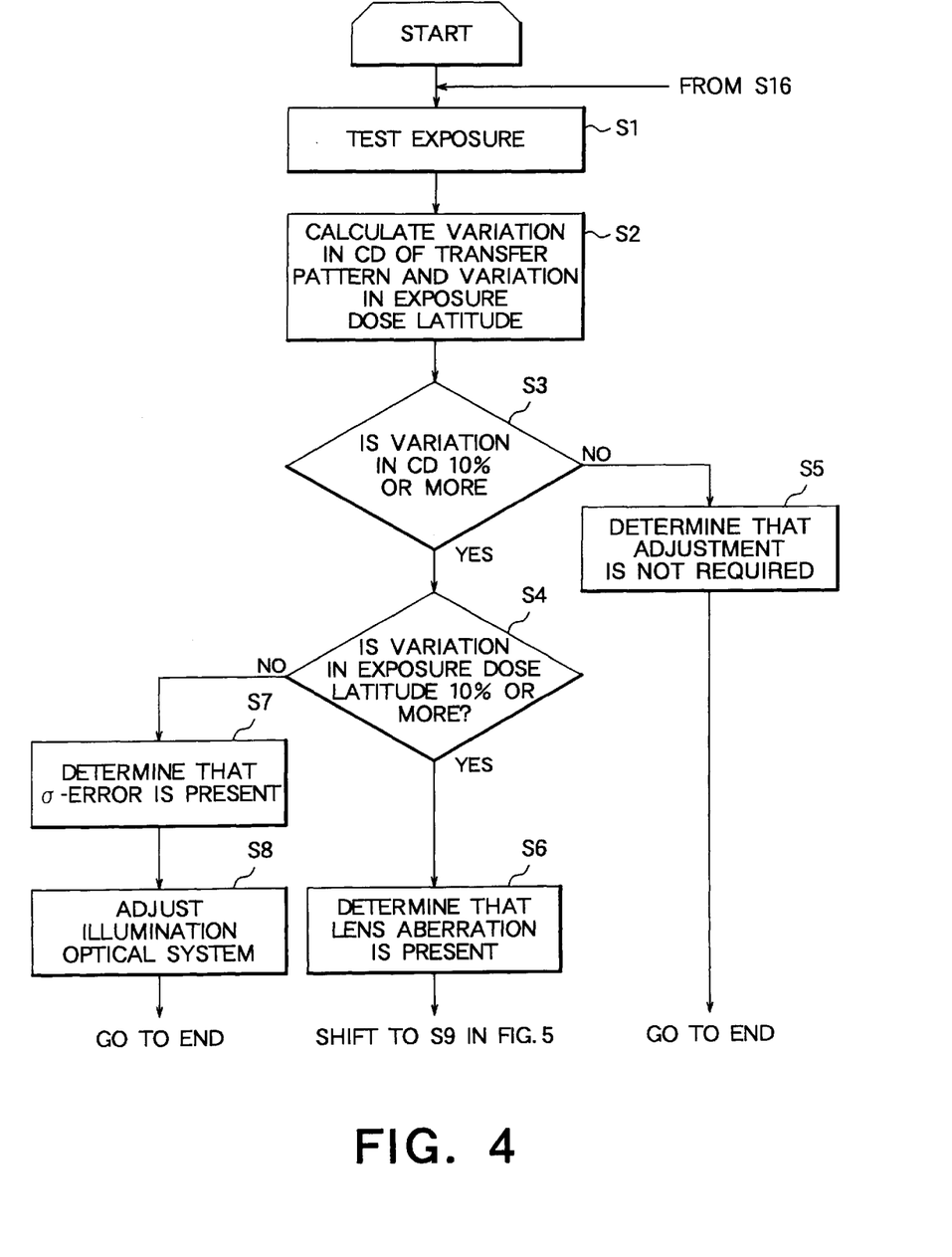
FIG. 4 is a flow chart showing a flow of a method of adjusting a reduction projection exposure device according to a concrete embodiment of the present invention.
Figure 5:
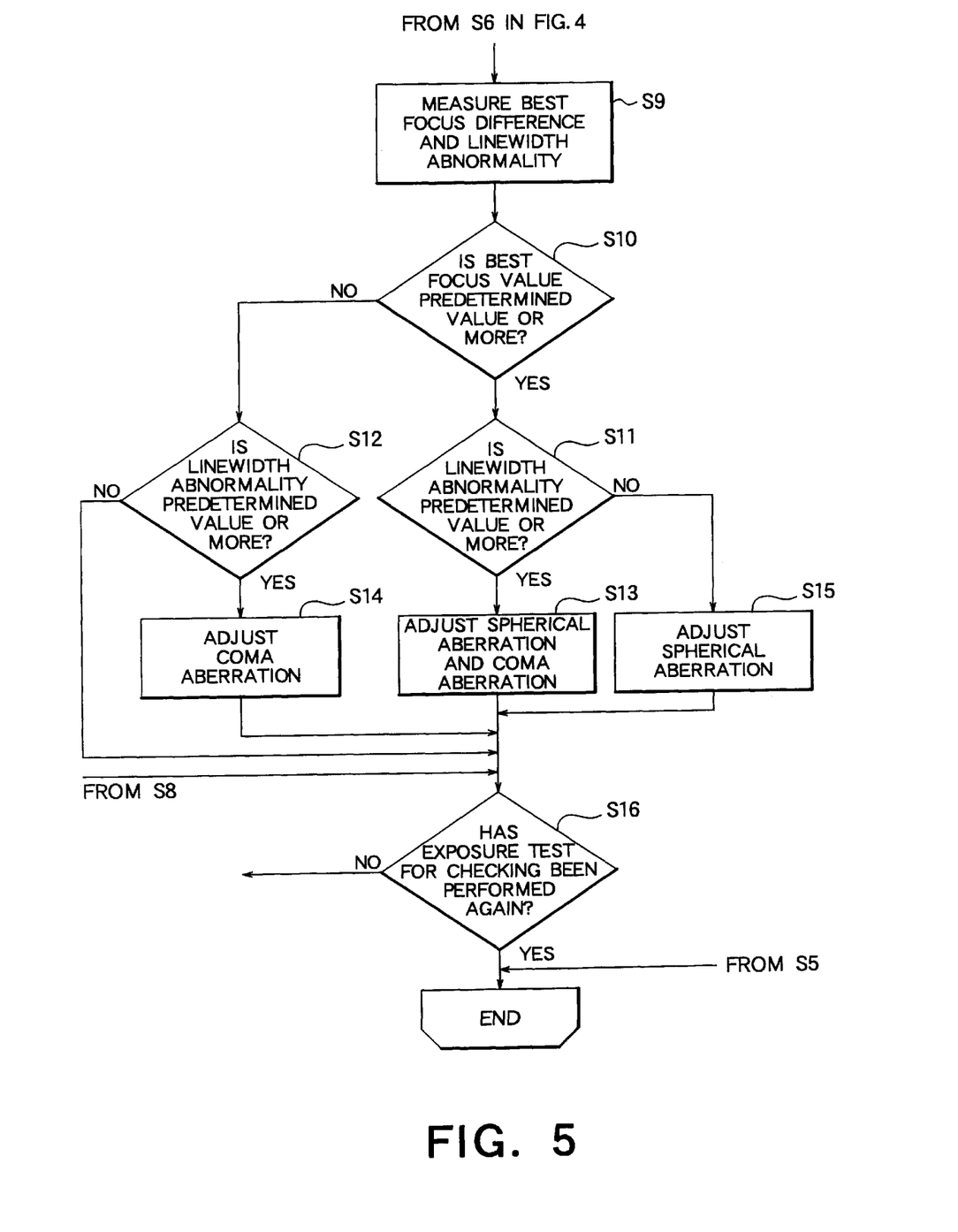
FIG. 5 is a flow chart showing a flow subsequent to the flow chart in FIG. 4.

FIGS. 4 and 5 are flow charts showing flows of a method of adjusting a reduction projection exposure device according to the concrete embodiment.

The concrete embodiment is a method of adjusting a reduction projection exposure device (as shown in FIG. 1) comprising a light source, an illumination optical system for causing light emitted from the light source to have a uniform light intensity distribution, and a reduction image-forming optical system for irradiating a mask pattern of a photomask on a photoresist film of a wafer by the light passing through the illumination optical system to obtain a transfer pattern.

In the concrete embodiment, as shown in FIG. 4, first, in the first step $S_1$, test exposure is performed such that, by using a test mask having nine identical mask patterns on a mask surface, identical transfer patterns are transferred to nine positions in an exposure field on a photoresist film by one exposure shot.

Figure 6:
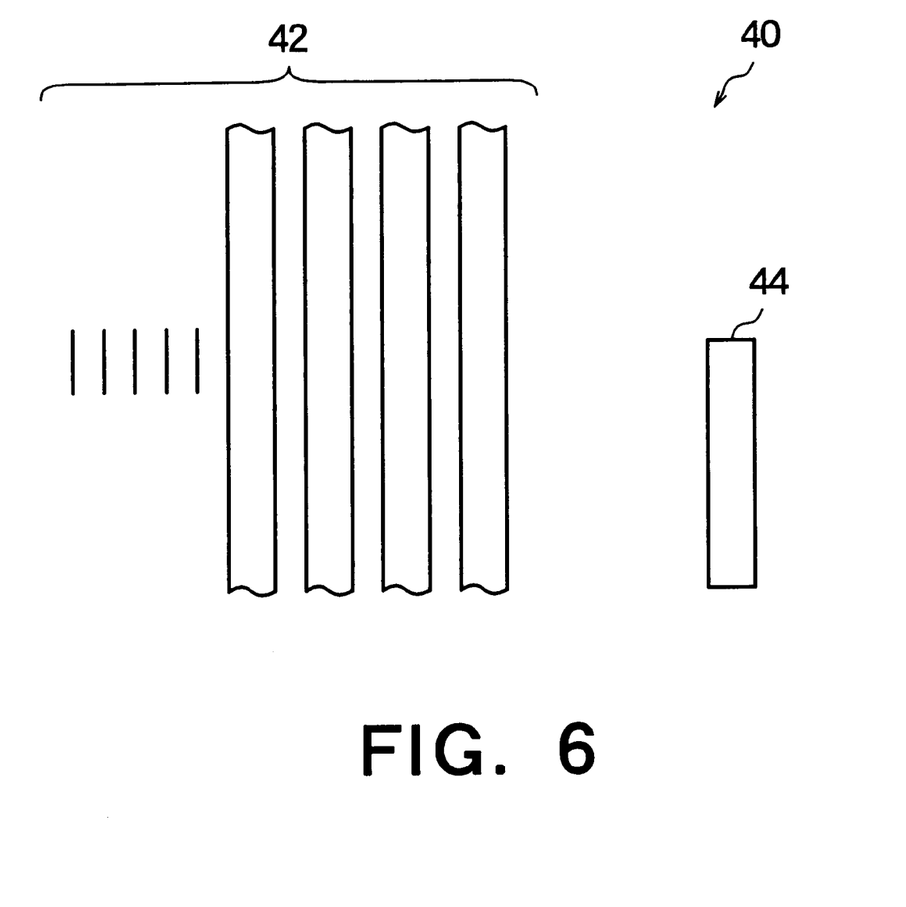
FIG. 6 is a plan view showing an example of a mask pattern used in a concrete embodiment of the present invention.

A mask pattern 40 used in the concrete embodiment has, as shown in FIG. 6, a high-density pattern 42 in which a large number of line-like patterns are parallel arranged at line width intervals, and one independent pattern 44 arranged an interval four to five times the line width away from the high-density pattern 42.

In the second step $S_2$, a dimensional variation in CD of identical transfer patterns in an exposure field and a variation in exposure margin in the exposure field are calculated.

The dimensional variation in CD of the transfer patterns is calculated by (range value of dimensions of CDs/average value of dimensions of CDs), and the variation in exposure dose latitude is calculated by (range value of exposure dose latitudes/average value of exposure dose latitudes).

In the third step $S_3$, whether the dimensional variation of the CDs of the identical transfer patterns in the exposure field is equal to or smaller than a predetermined percent or not is determined. In the concrete embodiment, the predetermined percent is set to be 10%, whether the dimensional variation in CD of the identical transfer patterns in the exposure field is equal to or larger than 10% or smaller than 10%.

When the dimensional variation is equal to or larger than 10%, the control flow shifts to the fourth step $S_4$. On the other hand, when the dimensional variation is smaller than 10%, the control flow shifts to the fifth step $S_5$ to determine that the illumination optical system and the reduction image-forming optical system are not required to be adjusted.

Subsequently, in the fourth step $S_4$, whether the variation in exposure dose latitude is equal to or larger than 10% or smaller than 10% is determined. When the variation in exposure dose latitude is equal to or larger than 10%, the control flow shifts to the sixth step $S_6$. On the other hand, when the variation in exposure dose latitude is smaller than 10%, the control flow shifts to the seventh step $S_7$ to determine that the illumination optical system includes a σ-error to be adjusted.

Subsequently, in the eighth step $S_8$, the illumination optical system is adjusted to decrease the σ-error. Upon completion of the adjustment, test exposure is performed again, and the respective steps are checked to finish the method of the concrete embodiment.

In the sixth step $S_6$, when the variation in exposure dose latitude is equal to or larger than 10%, determination that the reduction image-forming optical system includes a lens aberration to be adjusted is made, and the control flow shifts to the ninth step $S_9$.

Subsequently, in the ninth step $S_9$ shown in FIG. 5, a best focus difference and a linewidth abnormality are measured.

In the tenth step $S_{10}$, whether the best focus difference is equal to or larger than a predetermined value or not is determined. When the best focus difference is equal to or larger than the predetermined value, the spherical aberration is determined as a large spherical aberration, and the control flow shifts to the eleventh step $S_{11}$. When the best focus difference is smaller than the predetermined value, the control flow shifts to the twelfth step $S_{12}$.

In the eleventh step $S_{11}$, whether the linewidth abnormality is equal to or larger than a predetermined value or not is determined. When the linewidth abnormality is equal to or larger than the predetermined value, the coma aberration is determined as a large coma aberration, and the control flow shifts to the thirteenth step $S_{13}$. When the linewidth abnormality is smaller than the predetermined value, the control flow shifts to the fifteenth step $S_{15}$.

In the thirteenth step $S_{13}$, the spherical aberration and the coma aberration of the lens of the reduction image-forming optical system are adjusted such that both the best focus difference and the linewidth abnormality are smaller than the predetermined values. Upon completion of the adjustment, test exposure is performed again, and the respective steps are checked to finish the method of the concrete embodiment.

In the twelfth step $S_{12}$, whether the linewidth abnormality is equal to or larger than the predetermined value or not is determined. When the linewidth abnormality is equal to or larger than the predetermined value, the coma aberration is determined as a large coma aberration, and the control flow shifts to the fourteenth step $S_{14}$. When the linewidth abnormality is smaller than the predetermined value, an error probably occurs in the processes of in the first step $S_1$ to the twelfth step $S_{12}$. For this reason, test exposure is performed again, and the respective steps are checked to finish the method of the concrete embodiment.

In the fourteenth step $S_{14}$, the coma aberration of the lens of the reduction image-forming optical system is adjusted such that the linewidth abnormality is equal to or smaller than the predetermined value. Upon completion of the adjustment, test exposure is performed again, and the respective steps are checked to finish the method of the concrete embodiment.

In the fifteenth step $S_{15}$, since the coma aberration is not so large that the coma aberration is required to be adjusted, the spherical aberration of the reduction image-forming optical system is adjusted such that the linewidth abnormality is equal to the predetermined value. Upon completion of the adjustment, test exposure is performed again, and the respective steps are checked to finish the method of the concrete embodiment.

After the adjustment is performed through the steps $S_8$, $S_{12}$, $S_{13}$, $S_{14}$, and $S_{15}$, when the control flow shifts to the first step $S_1$ of the test exposure again, the control flow shifts to the sixteenth step $S_{16}$ to determine whether the exposure test for checking is performed again or not. If YES in the sixteenth step $S_{16}$, the method of the concrete embodiment is finished. If NO in the sixteenth step $S_{16}$, the control flow returns to the first step $S_1$ to perform the exposure test for checking.

By obtaining the above steps, in the method of the concrete embodiment, whether the illumination optical system or the reduction image-forming optical system of the exposure device is required to be adjusted can be reliably determined, and a required adjustment amount can be reliably determined.

According to the present invention, when a dimensional variation in identical transfer pattern in an exposure field is equal to or larger than the first predetermined percent, and when a variation in exposure dose latitude is smaller than the second predetermined percent, determination that the illumination optical system includes a σ-error to be adjusted is made. When the a dimensional variation in identical transfer pattern in the exposure field is equal to or larger than the first predetermined percent, and when a variation in exposure dose latitude is equal to or larger than the second predetermined percent, determination that the reduction image-forming optical system includes a lens aberration to be adjusted is made. Therefore, whether the illumination optical system or the reduction image-forming optical system of the exposure device is required to be adjusted can be reliably determined, and a required adjustment amount can be reliably determined.

What is claimed is:

1. A method of adjusting a reduction projection exposure device having a light source, an illumination optical system for causing light emitted from the light source to have a uniform light intensity distribution, and a reduction image-forming optical system for irradiating a mask pattern of a photomask on a photoresist film of a wafer by the light passing through the illumination optical system to obtain a transfer pattern, comprising:

the test exposure step of transferring identical transfer patterns at a plurality of positions on the photoresist film in one exposure field by using a test mask having a plurality of identical mask patterns on a mask surface;

the variation calculation step of calculating a dimensional variation in an identical transfer pattern in said one exposure field and a variation in exposure dose latitude in said one exposure field;

the first determination step of determining that the illumination optical system and the reduction image-forming optical system need not be adjusted when the dimensional variation in said identical transfer pattern in said one exposure field is smaller than a first predetermined percent;

the second determination step of determining that the illumination optical system includes a σ-error to be adjusted when the dimensional variation in said identical transfer pattern in said one exposure field is not smaller than the first predetermined percent and when the variation in said exposure dose latitude is smaller than a second predetermined percent; and the third determination step of determining that the reduction image-forming optical system includes a lens aberration to be adjusted when the dimensional variation in said identical transfer pattern in said one exposure field is not smaller than the first predetermined percent and when the variation in said exposure dose latitude is not smaller than the second predetermined percent.

2. A method of adjusting a reduction projection exposure device according to claim 1, wherein the test mask used in the test exposure step can transfer patterns having high-density patterns and independent patterns to at least nine positions uniformly distributed in an exposure field of one exposure shot.

3. A method of adjusting a reduction projection exposure device according to claim 2, wherein the dimensional variation in transfer pattern is defined by:

dimensional variation in transfer pattern=(range value of pattern dimensions/average value of pattern dimensions).

4. A method of adjusting a reduction projection exposure device according to claim 3, wherein the variation in exposure dose latitude is defined by:

variation in exposure dose latitude=(range value of exposure dose latitudes/average value of exposure dose latitudes).

5. A method of adjusting a reduction projection exposure device according to claim 4, comprising, subsequent to the third determination step, the first adjustment step of adjusting the reduction image-forming optical system such that the variation in exposure dose latitudes is not larger than the predetermined second percent.

6. A method of adjusting a reduction projection exposure device according to claim 5, wherein, in the first adjustment step, the spherical aberration is determined as a large spherical aberration to adjust the reduction image-forming optical system when the best focus difference is not smaller than a predetermined value, and the coma aberration is determined as a large coma aberration to adjust the reduction image-forming optical system when the linewidth abnormality is not smaller than a predetermined value.

7. A method of adjusting a reduction projection exposure device according to claim 6, comprising the second adjustment step for adjusting the illumination optical system such that a σ-error is decreased according to the determination performed in the second determination step.

* * * * *

UNITED STATES PATENT AND TRADEMARK OFFICE
CERTIFICATE OF CORRECTION

PATENT NO. : 6,208,469 B1
DATED : March 27, 2001
INVENTOR(S) : Seiji Matsuura

Page 1 of 1

It is certified that error appears in the above-identified patent and that said Letters Patent is hereby corrected as shown below:

<u>Column 4,</u>
Line 10, delete "a-error" insert -- σ-error --;
Line 49, delete the 2$^{nd}$ occurrence of "σ"

<u>Column 6,</u>
Line 60, delete "μpm" insert -- μm --

Signed and Sealed this

Thirteenth Day of November, 2001

Attest:

NICHOLAS P. GODICI
*Attesting Officer*    *Acting Director of the United States Patent and Trademark Office*